United States Patent
Astigarraga et al.

(10) Patent No.: US 10,404,274 B2
(45) Date of Patent: Sep. 3, 2019

(54) SPACE COMPRESSION FOR FILE SIZE REDUCTION

(71) Applicant: International Business Machines Corporation, Armonk, NY (US)

(72) Inventors: Tara Astigarraga, Rochester, NY (US); Itzhack Goldberg, Haifa (IL); Jose Roberto Mosqueda Mejia, Jalisco (MX); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 15/406,774

(22) Filed: Jan. 15, 2017

(65) Prior Publication Data

US 2018/0203872 A1 Jul. 19, 2018

(51) Int. Cl.
*H03M 7/30* (2006.01)

(52) U.S. Cl.
CPC ........... *H03M 7/30* (2013.01); *H03M 7/3088* (2013.01); *H03M 7/705* (2013.01)

(58) Field of Classification Search
CPC ....... H03M 7/30; H03M 7/705; H03M 7/3088
See application file for complete search history.

(56) References Cited

U.S. PATENT DOCUMENTS

| | | | |
|---|---|---|---|
| 5,873,660 A * | 2/1999 | Walsh | B41J 5/30 |
| | | | 400/63 |
| 9,129,001 B2 | 9/2015 | Qian et al. | |
| 9,176,973 B1 | 11/2015 | Allison et al. | |
| 2002/0107866 A1 | 8/2002 | Cousins et al. | |
| 2002/0107887 A1 | 8/2002 | Cousins et al. | |

OTHER PUBLICATIONS

Grover, Chris "Word 2007: The Missing Manual," 2007, Pogue Press, O'Reilly, Chapter 2, pp. 29-31 and 56-59 (Year: 2007).*
RoryM, "Automated Search and Replace using a list," Nov. 23, 2008, https://www.excelforum.com/excel-programming-vba-macros/663269-automated-search-and-replace-using-a-list.html[Mar. 18, 2019 12:33:35 PM], all pages (Year: 2008).*
Wadih-Kanaan, "Automating find and replace for multiple words/phrases," Oct. 27, 2011,https://social.msdn.microsoft.com/Forums/en-US/ba11a2ae-b28d-41b3-b900-6b06de564fb3/automating-find-and-replace-for-multiple-wordsphrases[Mar. 18, 2019 11:58: 03 AM], all pages (Year: 2011).*

(Continued)

*Primary Examiner* — Richard L Bowen
(74) *Attorney, Agent, or Firm* — Zilka-Kotab, P.C.

(57) ABSTRACT

A computer-implemented method according to one embodiment includes receiving a text document for storage within a storage device. The text document includes a plurality of words which are separated by spaces. Further, each word includes a last letter. The computer-implemented method also includes replacing the last letter of each word in the text document with a replacement symbol and removing the space after each word so as to reduce the file size of the text document to create a reduced file size text document. The computer-implemented method further includes storing the reduced file size text document within the storage device.

20 Claims, 8 Drawing Sheets

(56) References Cited

OTHER PUBLICATIONS

Jhseymour, "How to automate find/replace code in VBA modules in MS Office 2013?," 2015, https://stackoverflow.com/questions/30848609/how-to-automate-find-replace-code-in-vba-modules-in-ms-office-2013[Mar. 18, 2019 12:46:41 PM], all pages (Year: 2016).*
Wyatt, Allen, "Mass Search and Replace," Oct. 6, 2014, https://word.tips.net/T001462_Mass_Search_and_Replace.html[Mar. 18, 2019 1:25:05 PM], all pages (Year: 2014).*
Akkas, Emer, "Multiple find and replace macro for Excel," Sep. 8, 2012, http://www.emreakkas.com/localization-engineering/multiple-find-and-replace-macro-for-excel[Mar. 18, 2019 12:35:29 PM], all pages. (Year: 2012).*
Anonymously; "Technique for condensing the size of text documents for storage and transfer"; http://ip.com/IPCOM/000130445D; Nov. 9, 2005.
Anonymously; "Enhanced Data File Compression Method for Data Movement"; http://ip.com/IPCOM/000229452D; Jul. 30, 2013.
Broder, A. et al.; "Pattern-based compression of text images"; Office of Naval Research, Digital Systems Research Center; www.eecs/harvard.edu/michelm.../doc96.cont/pdf. 1996.

* cited by examiner

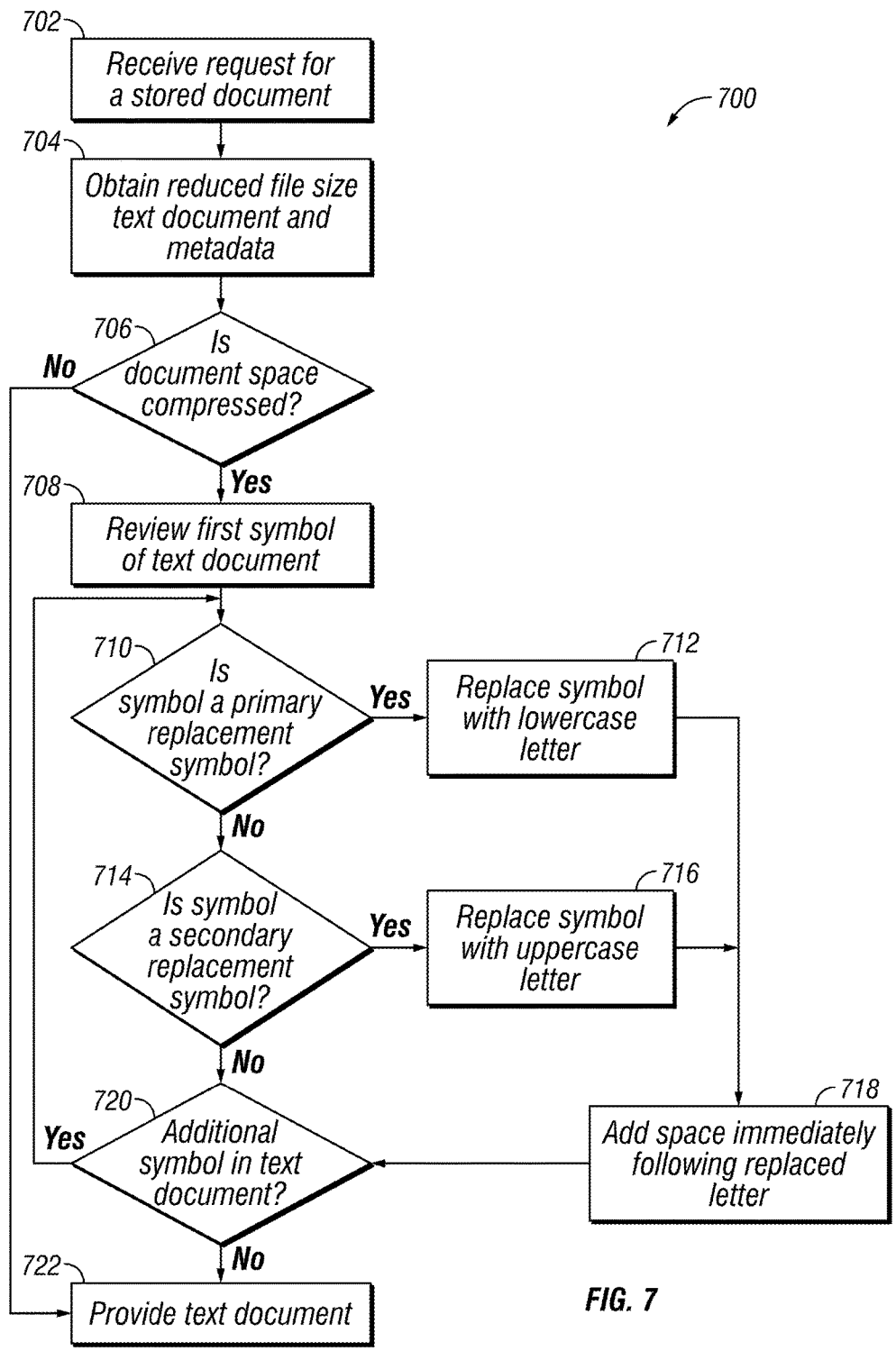

New York is a state in the USA on the continent of North America.

NeØYoršiÝåstatõiïthðUSåoïthõcontinen¥ofNortýAmericå.

NeWYorKiSAstatEiNthEUSAoNthEcontinenToFNortHAmericA.

SPACE COMPRESSION FOR FILE SIZE REDUCTION

BACKGROUND

The invention relates to reducing storage space required for a file, and more particularly, to file size reduction utilizing space compression within a storage environment.

The explosion of data challenges companies to process, analyze, and store unprecedented large volumes of data. A large portion of the data is text based and stems from both traditional and new fast growing data sources such as documents, emails, social network data, machine generated data (e.g., internet of things), sensor data, geolocation data, etc. As enterprises and information technology industries prepare to store this emerging data it becomes increasingly important to provide new and innovative techniques to store data more efficiently.

SUMMARY

The following description discloses several preferred embodiments of systems, methods and computer program products for performing space compression for file size reduction. Various embodiments provide a method to replace the last letter of each word of a text document with a replacement symbol and remove the space after each word so as to reduce the file size of the text document to create a reduced file size text document and storing the reduced file size text document. More particularly, described are embodiments of an invention for space compression of a text document to reduce the file size of the text document and to store the reduced file size text document on local storage or remote storage. Further described are embodiments of an invention for space compression of a text document to reduce the file size of the text document so that the reduced file size document can be transmitted over a network and stored in storage.

A computer-implemented method according to one embodiment includes receiving a text document for storage within a storage device, where the text document includes a plurality of words which are separated by spaces and each word includes a last letter, replacing the last letter of each word in the text document with a replacement symbol, removing the space after each word so as to reduce the file size of the text document to create a reduced file size text document, and storing the reduced file size text document within the storage device.

According to another embodiment, a computer program product for reducing the file size of a text document, the computer program product includes a computer readable storage medium having program instructions embodied therewith, wherein the computer readable storage medium is not a transitory signal per se, and where the program instructions are executable by a processor to cause the processor to perform a method including receiving a text document for storage within a storage device, where the text document includes a plurality of words which are separated by spaces and each word includes a last letter, replacing the last letter of each word in the text document with a replacement symbol, removing the space after each word so as to reduce the file size of the text document to create a reduced file size text document, and storing the reduced file size text document within the storage device A system according to another embodiment includes a processor and logic integrated with the processor, executable by the processor, or integrated with and executable by the processor, where the logic is configured to receive a text document for storage within a storage device, where the text document includes a plurality of words which are separated by spaces and each word includes a last letter, replace the last letter of each word in the text document with a replacement symbol, remove the space after each word so as to reduce the file size of the text document to create a reduced file size text document, and store the reduced file size text document within the storage device.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 6A illustrates a replacement symbol mapping of letters and their corresponding replacement symbols in accordance with one embodiment.

FIG. 6B illustrates a replacement symbol mapping of letters and their corresponding replacement symbols in accordance with one embodiment.

FIG. 6C illustrates a replacement symbol mapping of letters and their corresponding replacement symbols in accordance with one embodiment.

FIG. 7 illustrates a method for retrieving a text document that has been space compressed for file size reduction, in accordance with one embodiment.

DETAILED DESCRIPTION

Figure 1:
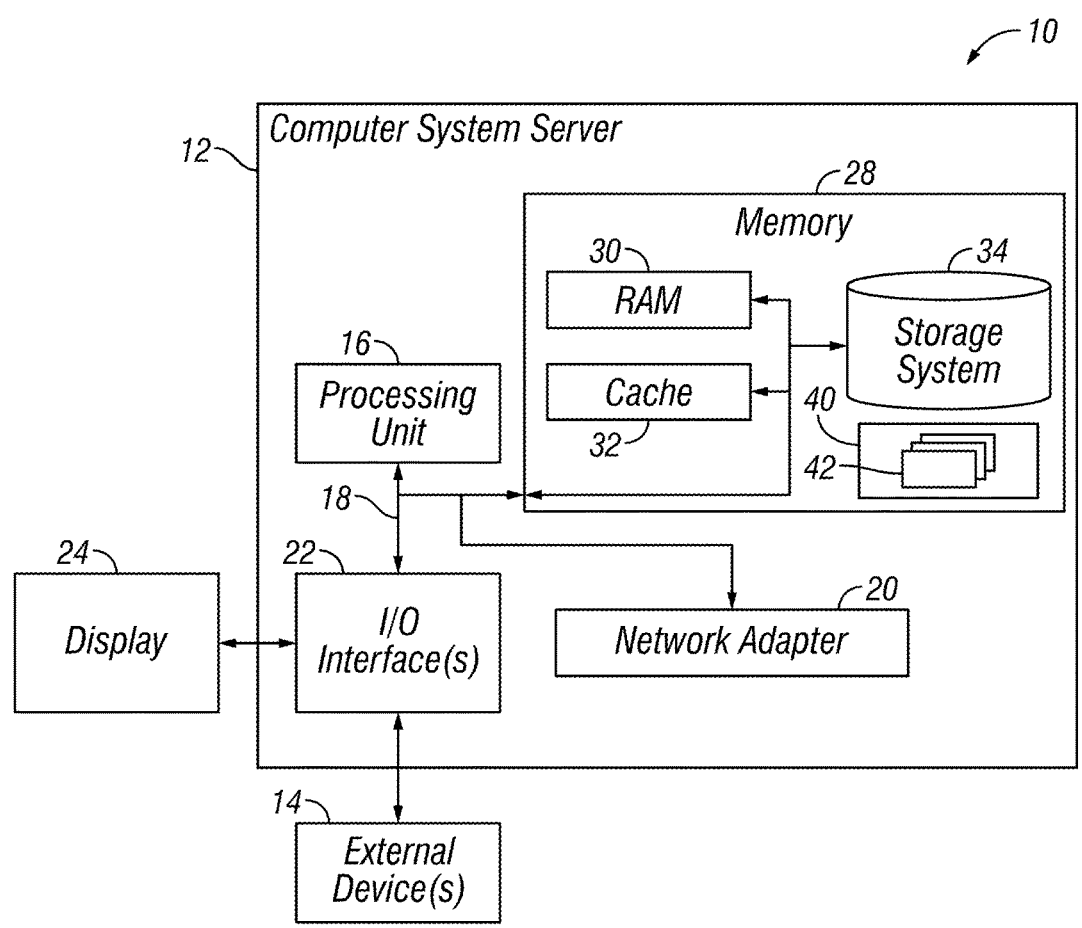
FIG. 1 depicts a cloud computing node according to an embodiment of the present invention.

The following description discloses several preferred embodiments of systems, methods and computer program products for performing space compression for file size reduction. Various embodiments provide a method to replace the last letter of each word of a text document with a replacement symbol and remove the space after each word so as to reduce the file size of the text document to create a reduced file size text document and storing the reduced file size text document. More particularly, described are embodiments of an invention for space compression of a text document to reduce the file size of the text document and to store the reduced file size text document on local storage or remote storage. Further described are embodiments of an invention for space compression of a text document to reduce the file size of the text document so that the reduced file size document can be transmitted over a network and stored in storage.

The described embodiments improve the storage efficiency of the text document while allowing fast access of the data upon retrieval and low overhead. If the average book has 380,000 characters, 64,000 words and 12,000 sentences, then the described methods of space compression of a text document to a reduced file size text document are estimated to save approximately 12% of storage space. Further, the described method does not limit further compression or other data reduction techniques in combination with the described embodiments such that even further space saving can be realized. For example, it is estimated that the described methods of space compression of a text document to a reduced file size text document on a previously zipped file will save an additional 6% of storage space. As companies continue to see unprecedented large volumes of data the described methods will aid in storing and transmitting data more efficiently.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for performing cloud computing environment activity monitoring.

In one general embodiment, a computer-implemented method includes receiving a text document for storage within a storage device, where the text document includes a plurality of words which are separated by spaces and each word includes a last letter, replacing the last letter of each word in the text document with a replacement symbol, removing the space after each word so as to reduce the file size of the text document to create a reduced file size text document, and storing the reduced file size text document within the storage device.

In another general embodiment, a computer program product for reducing the file size of a text document, the computer program product includes a computer readable storage medium having program instructions embodied therewith, wherein the computer readable storage medium is not a transitory signal per se, and where the program instructions are executable by a processor to cause the processor to perform a method including receiving a text document for storage within a storage device, where the text document includes a plurality of words which are separated by spaces and each word includes a last letter, replacing the last letter of each word in the text document with a replacement symbol, removing the space after each word so as to reduce the file size of the text document to create a reduced file size text document, and storing the reduced file size text document within the storage device.

According to another embodiment, a system includes a processor and logic integrated with the processor, executable by the processor, or integrated with and executable by the processor, where the logic is configured to receive a text document for storage within a storage device, where the text document includes a plurality of words which are separated by spaces and each word includes a last letter, replace the last letter of each word in the text document with a replacement symbol, remove the space after each word so as to reduce the file size of the text document to create a reduced file size text document, and store the reduced file size text document within the storage device.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the c loud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples include, but are not limited to: microcode, device drivers, redundant processing units, external disk drive arrays, RAID systems, tape drives, and data archival storage systems, etc.

Figure 2:
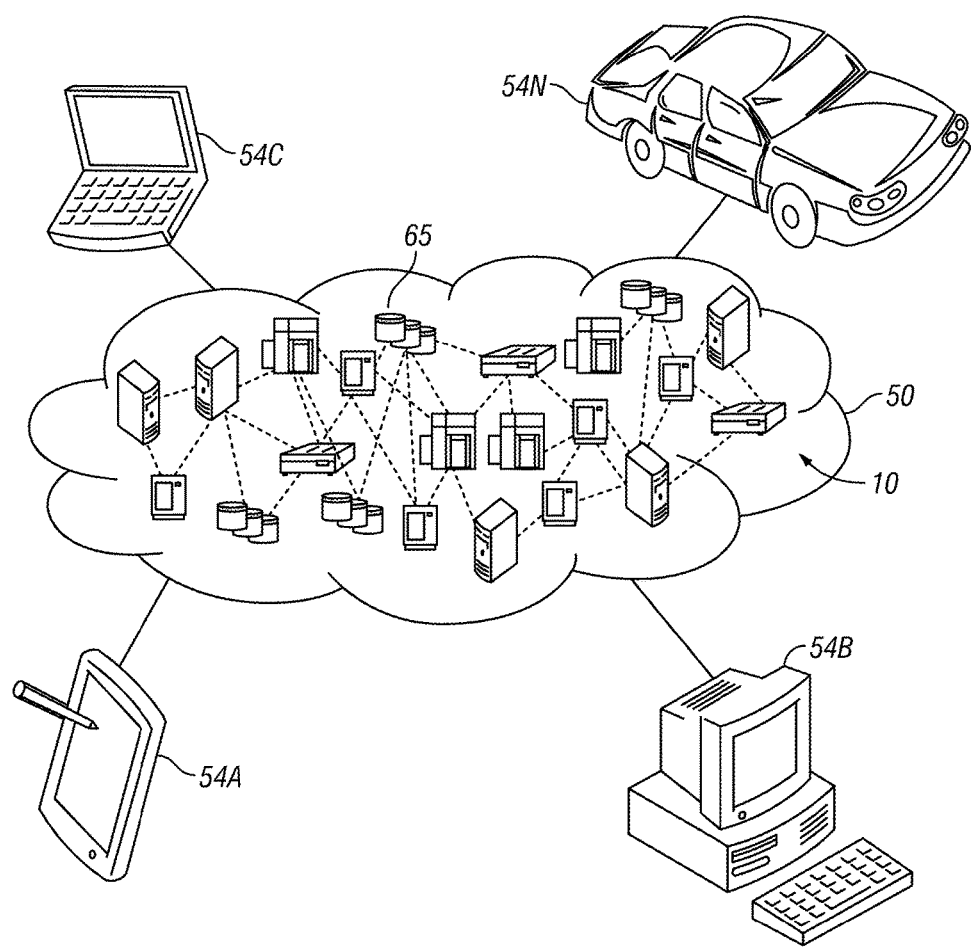
FIG. 2 depicts a cloud computing environment according to an embodiment of the present invention.

Referring now to FIG. 2, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
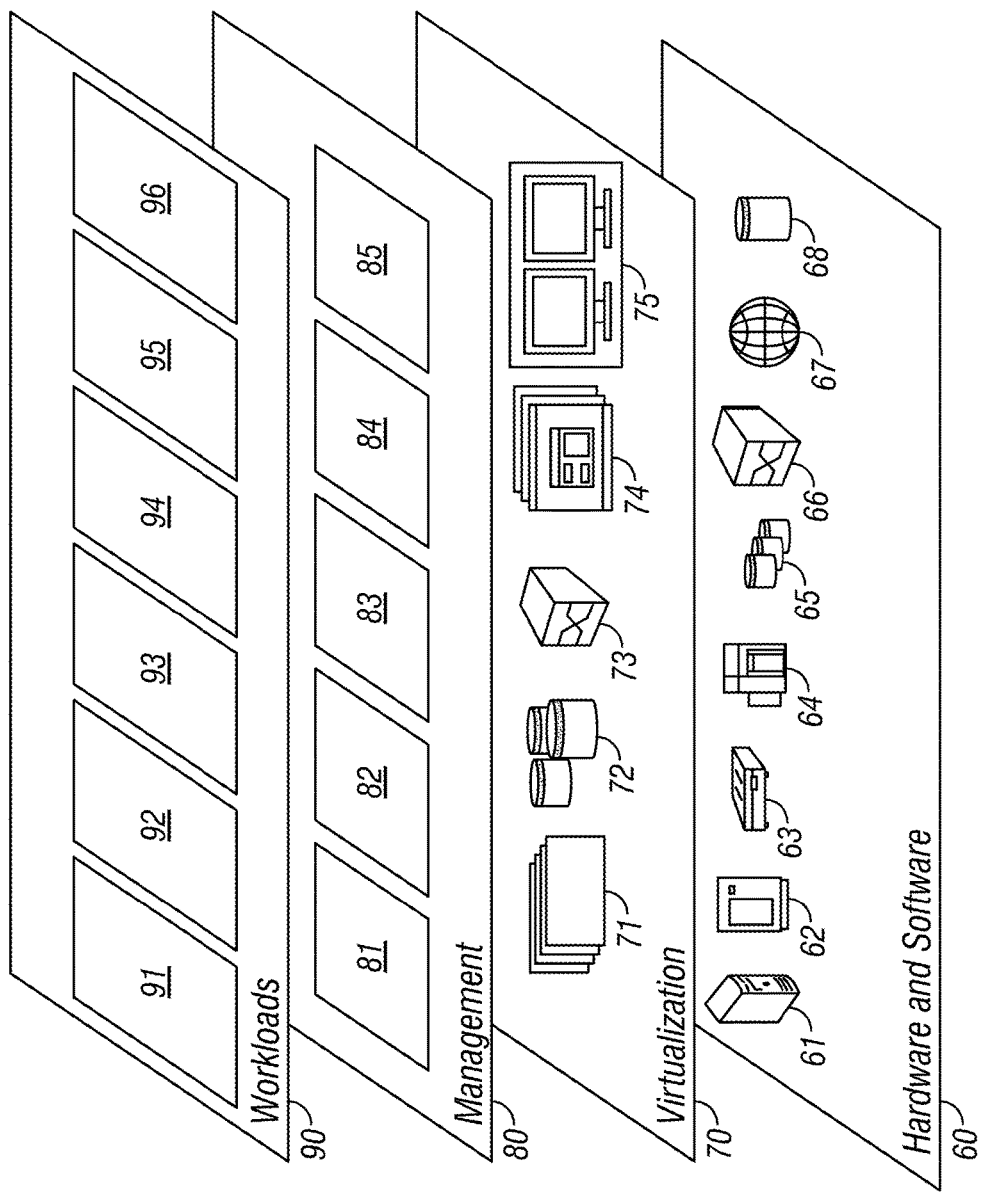
FIG. 3 depicts abstraction model layers according to an embodiment of the present invention.

Referring now to FIG. 3, a set of functional abstraction layers provided by cloud computing environment 50 (FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and data storage 96.

Figure 4A:
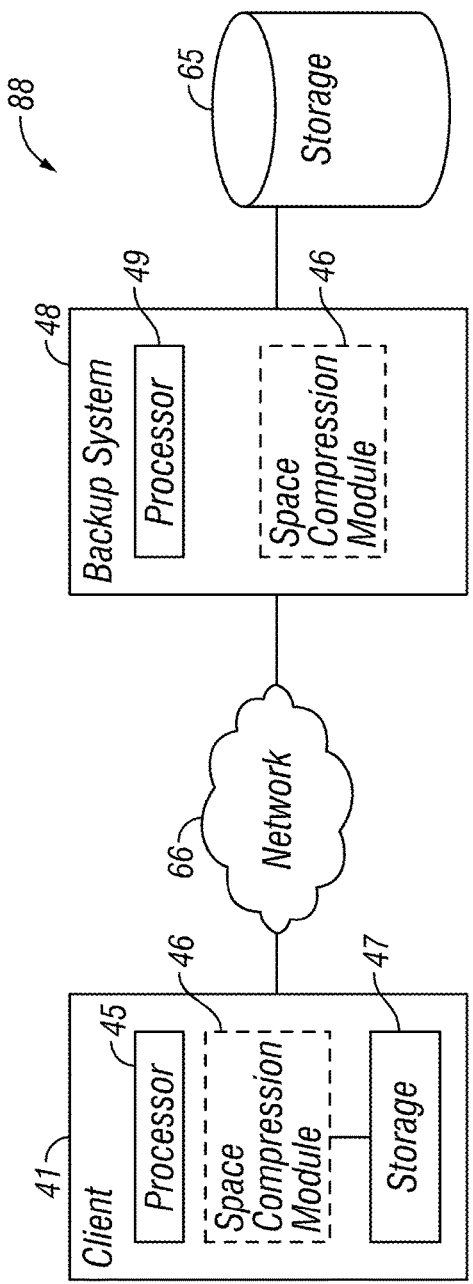
FIG. 4A depicts a computing environment according to an embodiment of the present invention.

In accordance with one embodiment, FIG. 4A, is a diagram illustrating a computing environment 88 that performs data operations such as read operations, write operations, backup operations, and the like. The computing environment 88 includes computing systems such as a backup system 48 and client 41. The backup system 48 and client 41 communicate with each other via a network 66.

In one embodiment, for example, backup system 48, could be a file server, a storage manager, a web application server, or a Network-attached storage (NAS). Backup system 48 may also be part of a Storage Area Network (SAN) network. Backup system 48 may include processor 49 capable of executing program code.

Client 41 may include local storage 47. In practice, the local storage 47 can be a magnetic disk drive, or solid state storage device, such as a flash memory. Client 41 may include processor 45 capable of executing program code. In addition, each client 41 may include space compression module 46. It should be appreciated that space compression module 46 can be a software module, firmware module, or combination software/firmware module that enables data backups using the inventive concepts described herein.

It should be appreciated that the computing system(s) can be any device capable of processing data, such as, a server, mainframe, personal computer, laptop, or mobile device, which includes smartphones and the like. It should be understood by one of ordinary skill in the art that the computing systems can include additional components such as at least one processor, memory, a network adapter, and antenna that are managed by an operating system.

Further, the computing device may include a user interface, such as a keyboard, touchscreen, or pointing device that enables user input. Finally, the computing device may include a user viewable screen displaying a graphical user interface (GUI) or text-based interface, such as a Command Line Interface (CLI).

Many general or special purpose operating systems exist that manage the components of the computing system, such as Lunix, or other Unix-type operating systems and Microsoft Windows-style operating systems. The operating systems can organize data using "file systems", which are data repositories for files.

In one embodiment, as illustrated by FIG. 4A, the computing system includes storage 65 for storing data. Storage 65 can include storage devices, such as storage arrays, including disk arrays, a tape arrays, and a solid state device arrays, which may be organized under a Redundant Array of Inexpensive/Independent Disks (RAID) level. A disk array can include magnetic disks and optical disks. A tape array can include tape and a solid state device array can include solid state devices (SSDs). It should be appreciated that one may combine the magnetic disks, optical disks, tapes, and SSDs on a single array. In one embodiment storage 65 is cloud storage as described with respect to FIGS. 1-3.

Network 66 may include any number of switches, routers, and other specialized network computing devices providing data transfer services between computing systems of the computing environment 88. Accordingly, the backup system 48 can bi-directionally communicate data to and from the client(s) 41. Specifically, client 41 may request the services of the backup system 48, by exchanging data packets over the network 66. The client 41 may issue data packets using file-based access protocols or block-based access protocols. Such protocols are common and include the Common Internet File System (CIFS) protocol, Network File System (NFS) protocol, Transmission Control Protocol/Internet Protocol (TCP/IP), Small Computer Systems Interface (SCSI) protocol encapsulated over TCP (iSCSI) and SCSI encapsulated over Fibre Channel (FCP). It should be appreciated that any computing system may communicate with any other computing system of the computing environment 88 in this manner.

As discussed above, in one embodiment client 41 includes space compression module 46 and local storage 47. Space compression module 46 includes replacement symbol mapping 600 (as described in FIGS. 6A, 6B, and 6C) and policy. Policy may be created by a user, an Information Technology (IT) administrator, or other administrator, or alternatively, it may be preconfigured by the manufacturer.

In an embodiment in which client 41 includes space compression module 46 and local storage 47, the space compression module 46 may be used to perform space compression on a text document to reduce the file size of the text document and store the reduced file size text document on local storage 47. Alternatively, in this embodiment, the space compression module 46 may be used to perform space compression on a text document to reduce the file size of the text document so that a reduced file size text document is transmitted over network 66 to store in storage 65.

In an embodiment in which the user stores a text document to their local storage 47, the space compression module 46 of the client 41 performs the space compression process and stores the reduced file size text document within local storage 47 and subsequently retrieves the text document as described in FIGS. 5-7, and 8A-8C.

In one embodiment the backup system 48 includes space compression module 46. Space compression module 46 includes replacement symbol mapping 600 (as described in FIGS. 6A, 6B, and 6C) and policy. Policy may be created by a user, an Information Technology (IT) administrator, or other administrator, or alternatively, it may be preconfigured by the manufacturer.

In one embodiment in which the user stores a text document remotely, whether to cloud storage or other offsite location, the client 41 transmits the text document to backup system 88. Backup system 88 receives the text document and the space compression module 46 performs the space compression process and stores the reduced file size text document within storage 65 and subsequently retrieves the text document as described in FIGS. 5-7, and 8A-8C.

Figure 4B:
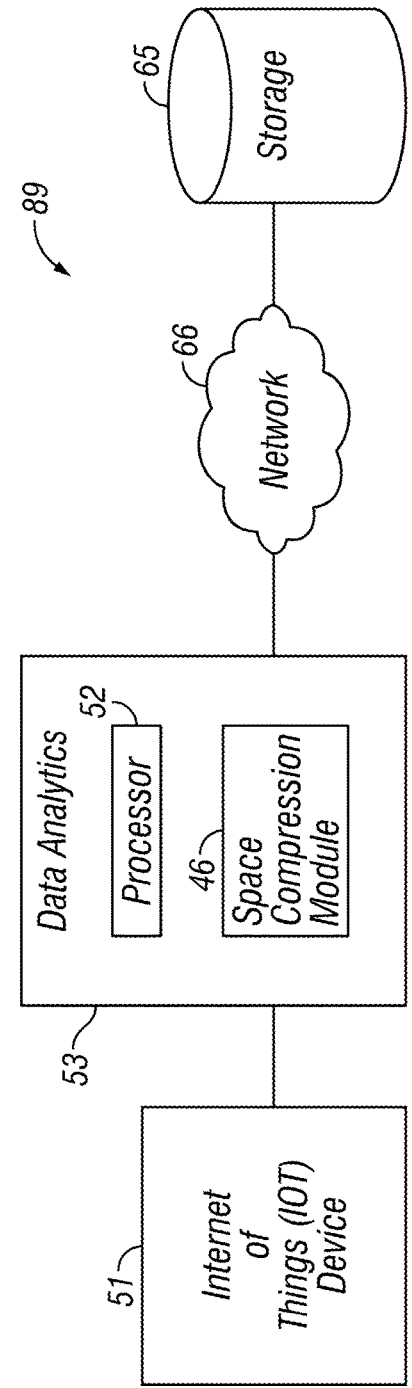
FIG. 4B depicts a computing environment according to an embodiment of the present invention.

In accordance with one embodiment, FIG. 4B, is a diagram illustrating a computing environment 89 that performs data operations such as read operations, write operations, backup operations, and the like. The computing environment 89 includes computing systems such an internet of things (IOT) device 51 and data analytics module 53. The IOT device may be any IOT device that generates data such as a vending machine, a connected vehicle, a healthcare machine, etc. One of ordinary skill in the art would understand that while in one embodiment the computing environment 89 is described as having an IOT device 51, that any the IOT device 51 could be any edge device that generates data.

Data analytics module 53 receives the data from the IOT device 51 and preforms any necessary analysis on the data before storing the data in storage 65. Data analytics module 53 may include processor 52 capable of executing program code. In one embodiment, data analytics module 53 includes a space compression module 46. It should be appreciated that space compression module 46 can be a software module, firmware module, or combination software/firmware module that enables space compression using the inventive concepts described herein. Space compression module 46 includes replacement symbol mapping 600 (as described in FIGS. 6A, 6B, and 6C) and policy. Policy may be created by a user, an Information Technology (IT) administrator, or other administrator, or alternatively, it may be preconfigured by the manufacturer.

In one embodiment, as illustrated by FIG. 4B, the computing system includes storage 65 for storing data. Storage 65 can include storage devices, such as storage arrays, including disk arrays, a tape arrays, and a solid state device arrays, which may be organized under a Redundant Array of Inexpensive/Independent Disks (RAID) level. A disk array can include magnetic disks and optical disks. A tape array can include tape and a solid state device array can include solid state devices (SSDs). It should be appreciated that one may combine the magnetic disks, optical disks, tapes, and SSDs on a single array. In one embodiment storage 65 is cloud storage as described with respect to FIGS. 1-3.

The IOT device 51 and the data analytics module 53 are connected to storage 65 through a network 66. In one embodiment, network 66 is a network cloud. Network 66 may include any number of switches, routers, and other specialized network computing devices providing data transfer services between computing systems of the computing environment 89. Accordingly, the IOT device 51 can bi-directionally communicate data to and from the storage 65. Specifically, IOT device 51 may request the services of storage 65, by exchanging messages or data packets over the network 66. The IOT device 51 may issue messages or data packets using file-based access protocols or block-based access protocols. Such protocols include hypertext transport protocol (HTTP) and simple object access protocol (SOAP). It should be appreciated that any computing system may communicate with any other computing system of the computing environment 89 in this manner.

In an embodiment in which the IOT device 51 generates data and data analytics module 53 determines that that data is a text document that is to be stored in storage 65, then compression module 46 performs the space compression process and stores the reduced file size text document within storage 65 and subsequently retrieves the text document as described in FIGS. 5-7, and 8A-8C Now referring to FIG. 5, a flowchart of a method 500 is shown according to one embodiment. The method 500 may be performed in accordance with the present invention in any of the environments depicted in FIGS. 1-3 and 4A-4B, among others, in various embodiments. Of course, more or less operations than those specifically described in FIG. 5 may be included in method 500, as would be understood by one of skill in the art upon reading the present descriptions.

Each of the operation s of the method 500 may be performed by any suitable component of the operating environment. For example, in various embodiments, the method 500 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more operation s of the method 500. Illustrative processors include, but are not limited to, a central processing unit (CPU), an application specific integrated circuit (ASIC), a field programmable gate array (FPGA), etc., combinations thereof, or any other suitable computing device known in the art. In one embodiment the operation s of method 500 may be performed by space compression module 46 as described herein.

In one embodiment, the computing environment may be a cloud computing environment which may include one or more cloud-based storage devices. For example, the cloud computing environment may include one or more of networked storage devices, a storage area network (SAN), a block storage environment, a cloud storage environment, a hybrid cloud storage environment, etc. In another embodiment, the cloud computing environment may include an embedded storage component. For example, the cloud computing environment may include flash storage embedded in one or more servers, one or more network switches, etc. In another embodiment, the cloud computing environment may be identified by a component of the environment, a device outside of the environment (e.g., a server device, a switch, etc.), etc. In yet another embodiment, software defined storage (SDS) may be implemented within the cloud computing environment.

Figure 5:
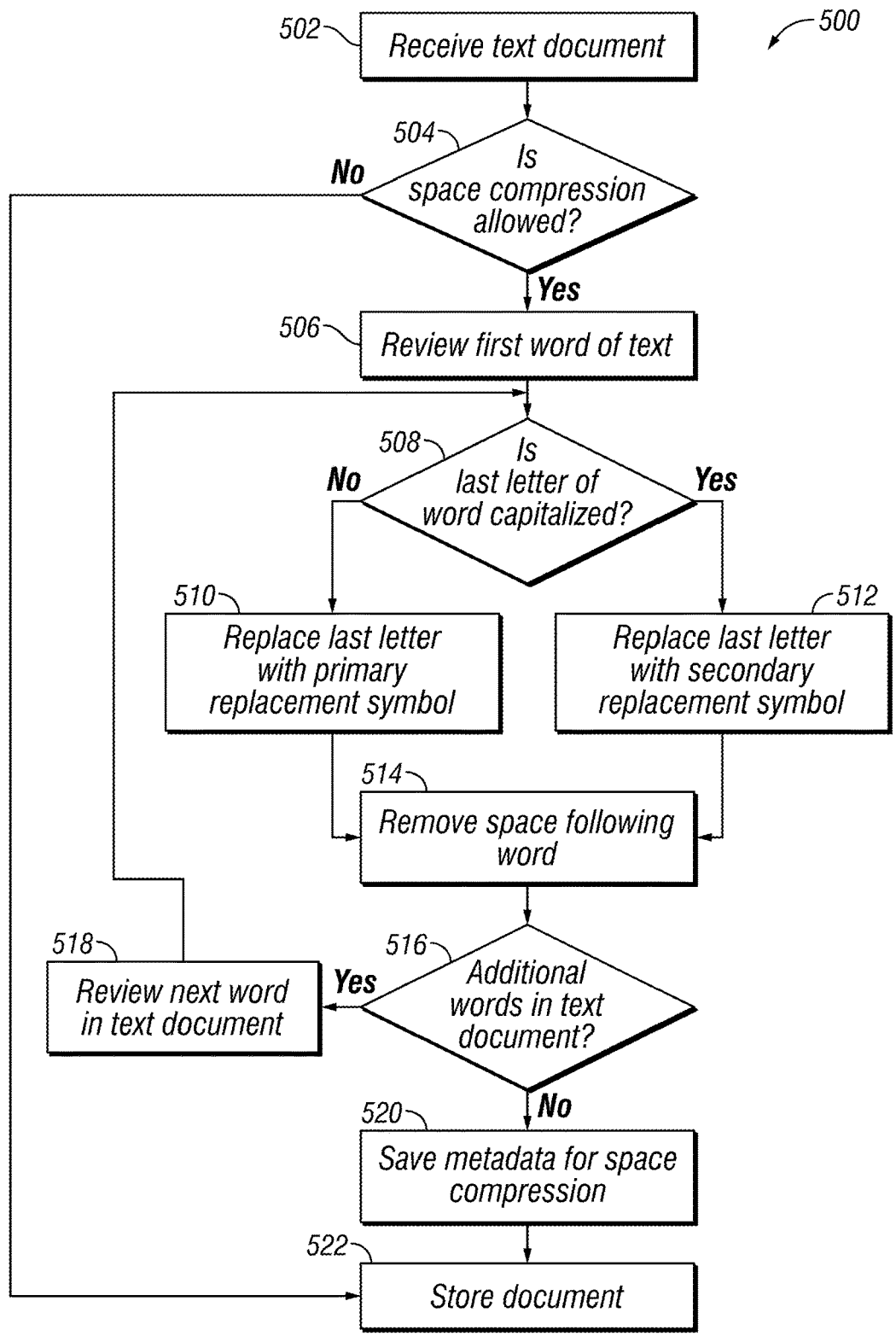
FIG. 5 illustrates a method for performing space compression for file size reduction, in accordance with one embodiment.

As shown in FIG. 5, method 500 may initiate with operation 502, where a text document is received by the space compression module 46. The text document can be any text document including, but not limited to, a word processing document, an email, social network data, sensor data, geolocation data, and machine generated data (e.g. data generated by an IOT device), etc.

As shown in FIG. 5, method 500 may proceed with operation 504, where it is determined if space compression is allowed. As discussed above, in one embodiment space compression module 46 includes replacement symbol mapping 600 (as described in FIGS. 6A, 6B, and 6C) and policy. Policy may be created by a user, an Information Technology (IT) administrator, or other administrator, or alternatively, it may be preconfigured by the manufacturer. In one embodiment policy may indicate that all text files are allowed to be space compressed. In another embodiment, the policy for space compression may be set according to the source or destination of the data. Further, space compression may be allowed based on context of the text file. In one embodiment, the user could indicate that space compression is allowed for all text documents for that user. In another embodiment, the computing environment may indicate if space compression is allowed. Further, in one embodiment, a bit within the header of text document indicates if space compression was allowed. In one embodiment operation 504 is optional such that all text files are to be space compressed.

Furthermore, as shown in FIG. 5, method 500 may proceed with operation 506, where the first word of the text document is reviewed. One of ordinary skill in the art would understand that the words in the text document could be reviewed in any order. For example, the last word of the text document could be reviewed first, or alternatively, the review of each word could begin in the middle of the text document and move in any direction or to any word until all words within the text document are reviewed for space compression.

As shown in FIG. 5, method 500 may proceed with operation 508, where it is determined if the last letter of the word reviewed in operation 506 is capitalized (i.e., an upper case letter). If it is determined in operation 508 that the last letter of the word is not capitalized (i.e., a lower case letter) then the process flows to operation 510

Figures 6A, 6B, 6C:
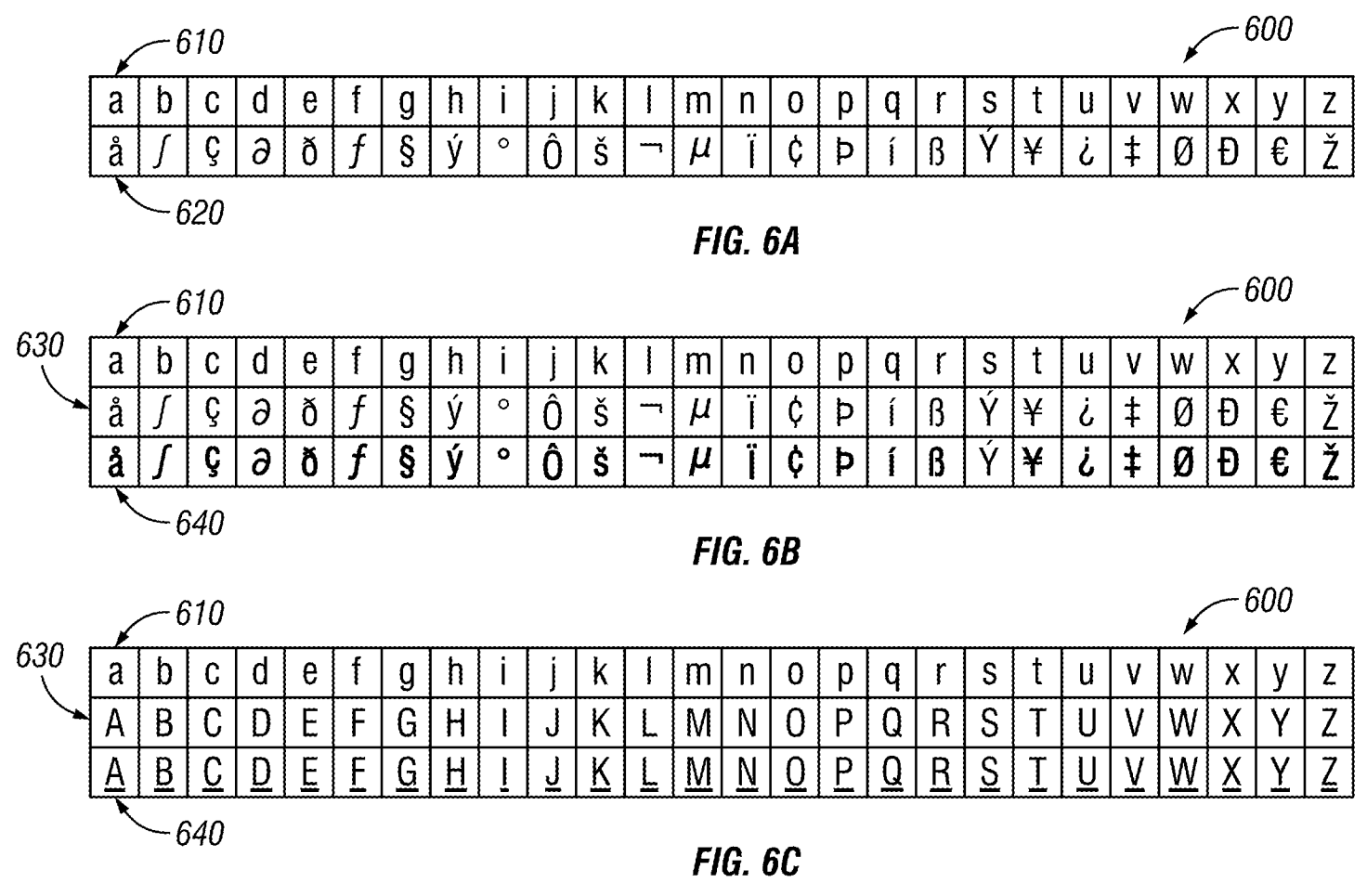

As shown in FIG. 5, method 500 may proceed with operation 510, where the last letter 610 (as shown in FIG. 6A, 6B, or 6C) of the word is replaced with a replacement symbol, and in one embodiment, a primary replacement symbol 630 (as shown in FIG. 6B or 6C). The replacement symbol is used to represent the last letter 610 and indicates there is a following space that is removed in operation 514.

FIG. 6A is a table illustrating a replacement symbol mapping 600 in one embodiment. Each letter 610 has a corresponding replacement symbol 520 such that during method 500 the last letter of the word is replaced with the corresponding replacement symbol 520.

FIG. 6B is a table illustrating replacement symbol mapping 600 in one embodiment. Each letter 610 has a corresponding primary replacement symbol 630 and secondary replacement symbol 640 such that during method 500 the last letter of the word is replaced with one of the primary replacement symbol 630 and secondary replacement symbol 640 described with respect to FIG. 5.

FIG. 6C is another table illustrating replacement symbol mapping 600 in another embodiment. Each letter 610 has a corresponding primary replacement symbol 630 and secondary replacement symbol 640 such that during method 500 the last letter of the word is replaced with one of the primary replacement symbol 630 and secondary replacement symbol 640 as described with respect to FIG. 5.

One of ordinary skill in the art would understand that the replacement symbol mapping 600 shown in FIGS. 6A, 6B, and 6C illustrate only examples of replacement symbols 620, primary replacement symbol 630, and secondary replacement symbol 640 that could be used to replace the last letter 610 of each word. Accordingly, letters 610 could be replaced with any replacement symbol known to represent the corresponding letter. Further, one of ordinary skill in the art would understand that the invention would apply to other languages having different letters and language characters such that a replacement symbol would correspond to each letter or language character for that particular language.

Although not shown, one of ordinary skill in the art would understand that this method could extend to punctuation marks in which a punctuation mark is replaced with a corresponding replacement symbol and the space or spaces removed immediately following the punctuation mark in the same manner that the last letter 610 of a word is replaced and the space immediately following the word is removed. Further, in one embodiment, if the punctuation mark is followed by a single space, then the punctuation mark may be replaced with a primary replacement symbol 630 to represent the corresponding punctuation mark and indicates that there is a following space that is removed. Accordingly, if the punctuation mark is followed by two spaces, then the punctuation mark may be replaced with a secondary replacement symbol 630 to represent the corresponding punctuation mark and indicates that there is a following space that is removed.

One of ordinary skill in the art would understand that some types of data may not include a combination of upper and lower case letters. Accordingly, in one embodiment, method 500 may be simplified. In particular, in one embodiment operation 508 is optional and operations 510 and 512 are replaced with a single operation that includes of replacing the last letter with a replacement symbol 620 (as shown in FIG. 6A).

Returning to FIG. 5, if it is determined in operation 508 that the last letter of the word is capitalized then the process flows to operation 512. As shown in FIG. 5, method 500 may proceed with operation 514, where the space following the word is removed. One of ordinary skill in the art would understand that the order of operation 510 and 514 could be interchanged or be performed simultaneously. Similarly, one of ordinary skill in the art would understand that the order of operation 512 and 514 could be interchanged or be performed simultaneously.

As shown in FIG. 5, method 500 may proceed with operation 516, where it is determined if there are additional words in the text document that have not yet been reviewed. If it is determined in operation 516 that there are additional words in the text document that have not yet been reviewed the process flows to operation 518. In operation 518 the next word in the text document is reviewed. Again, one of ordinary skill in the art would understand that the words in the text document could be reviewed in any order. As shown in FIG. 5, method 500 may proceed again with operation 508 for the next word, where it is determined if the last letter of the word reviewed in operation 506 is capitalized. In this way, each word of the text document is reviewed and the last letter of each word of the text document is replaced with a replacement symbol. Further the space after each word is removed so as to reduce the file size of the text document to create a reduced file size text document.

Returning to operation 516, if it is determined that there are no additional words in the text document, then the process flows to operation 520. In operation 520 metadata for the space compression is saved. In one embodiment, the metadata stored indicates that the document has been space compressed and may include the replacement symbol mapping 600 for the space compression. In one embodiment, a bit within the header of text document indicates the document was space compressed. One of ordinary skill in the art would understand that the invention should not be limited to storing the metadata within the header of the text document. Rather, any demarcation could be used to indicate that the text document was space compressed to ensure proper read back of the text document. For example, a bit could be changed within the packet transmitting the data to indicate that the text document has been space compressed.

As shown in FIG. 5, method 500 may proceed with operation 522, where the reduced file size text document is stored within the storage 47 or 65.

Now referring to FIG. 7, a flowchart of a method 700 is shown according to one embodiment. The method 700 may be performed in accordance with the present invention in any of the environments depicted in FIGS. 1-3, and 4A-B among others, in various embodiments. Of course, more or less operations than those specifically described in FIG. 7 may be included in method 700, as would be understood by one of skill in the art upon reading the present descriptions.

Each of the operation s of the method 700 may be performed by any suitable component of the operating environment. For example, in various embodiments, the method 700 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more operation s of the method 700. Illustrative processors include, but are not limited to, a central processing unit (CPU), an application specific integrated circuit (ASIC), a field programmable gate array (FPGA), etc., combinations thereof, or any other suitable computing device known in the art. In one embodiment the operation s of method 500 may be performed by space compression module 46 as described herein.

As shown in FIG. 7, method 700 may initiate with operation 702, where a request is received for a text document stored within storage 47 or 65. In one embodiment, the text document is space compressed and stored within storage 47 or 65 as a reduced file size text document.

As shown in FIG. 7, method 700 may proceed with operation 704, where the text document is obtained from storage 47 or 65 and the metadata for the text document is obtained. In one embodiment, the text document is a reduced file size text document that was space compressed according to method 500 described in FIG. 5. As discussed with respect to method 500, metadata may be stored within the text document to indicate that the text document is space compressed and is a reduced file size text document. In addition, the metadata may provide the replacement symbol mapping 600 for the reduced file size text document. For example, in one embodiment, metadata may be stored in operation 520 to indicate if the document was space compressed.

Furthermore, as shown in FIG. 7, method 700 may proceed with operation 706, where the metadata is checked to determine if the text document is space compressed. In one embodiment, a bit within the header of text document is checked to determine if the text document was space compressed by method 500. One of ordinary skill in the art would understand that the invention should not be limited to storing the metadata within the header of the text document. Rather, any demarcation could be used to indicate that the text document was space compressed to ensure proper read back of the text document. For example, a bit could be changed within the packet transmitting the data to indicate that the text document has been space compressed. Further, in embodiments where the storage 47 or 65 space compresses all text documents operation 706 may be optional.

As shown in FIG. 7, method 700 may proceed with operation 708, where the first symbol of the text document is reviewed. One of ordinary skill in the art would understand that the term symbol used herein includes any letters or symbols in the text document and thus includes letters 610, replacement symbol 620, primary replacement symbol 630, and secondary replacement symbol 640. One of ordinary skill in the art would further understand that the symbols in the text document could be reviewed in any order. For example, the symbols at the end of the document could be reviewed first, or alternatively, the review of each the symbols could begin in the middle of the text document.

As shown in FIG. 7, method 700 may proceed with operation 710, where it is determined if the symbol is a primary replacement symbol 630. If it is determined in operation 710 that the symbol is a primary replacement symbol 630, then the process flows to operation 712.

As shown in FIG. 7, method 700 may proceed with operation 712, where the primary replacement symbol 630 is replaced with a lower case letter that the primary replacement symbol 630 corresponds to. For example, the primary replacement symbol 630 is replaced with a lower case letter that the replacement symbol corresponds as shown in one of FIG. 6A, 6B or 6C.

As shown in FIG. 7, method 700 may proceed with operation 718, where a space is added immediately following the letter replaced in operation 712.

Returning to operation 710, if it is determined that the symbol is not a primary replacement symbol 630, then the process flows to operation 714.

As shown in FIG. 7, method 700 may proceed with operation 714, where it is determined if the symbol is a secondary replacement symbol 640. If it is determined in operation 714 that the symbol is a secondary replacement symbol 640, then the process flows to operation 716.

As shown in FIG. 7, method 700 may proceed with operation 716, where the secondary replacement symbol 640 is replaced with an upper case letter that the secondary replacement symbol 640 corresponds to. For example, the secondary replacement symbol 640 is replaced with an upper case letter that the replacement symbol corresponds to as shown in one of FIG. 6B or 6C.

As shown in FIG. 7, method 700 may proceed with operation 718, where a space is added immediately following the letter replaced in operation 716.

Further, as shown in FIG. 7, method 700 may proceed with operation 720, where it is determined if there is an additional symbol in the text document not yet reviewed.

As shown in FIG. 7, method 700 if it is determined that there is an additional symbol in the text document, then the process flows to operation 710 where it is determined if the symbol is a primary replacement symbol 630. As shown in FIG. 7, method 700 continues to find replacement symbols (e.g., replacement symbol 620, primary replacement symbols 630 and secondary replacement symbols 640) and replacing them with the letters that they correspond to and adding a space immediately following the letter replaced to recreate the text document such that it is in its original form (i.e., the form it was received in operation 502).

As shown in FIG. 7, method 700 if it is determined that there is not an additional symbol in the text document, then the process flows to operation 722.

As shown in FIG. 7, method 700 may proceed with operation 722 where the text document is provided in its original form.

Figure 8A:
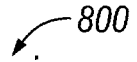
FIG. 8A illustrates an example text file, in accordance with one embodiment.
Figure 8B:
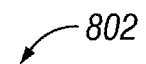
FIG. 8B illustrates an example text file that is space compressed, in accordance with one embodiment.
Figure 8C:
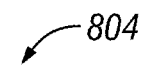
FIG. 8C illustrates an example text file that is space compressed, in accordance with one embodiment.

Now referring to FIG. 8A, an example of a text document 800 is shown according to one embodiment. FIG. 8B illustrates an example of a reduced file size text document 802 that is space compressed, in accordance with one embodiment. More particularly, FIG. 8B illustrates an example text file 800 that is space compressed by method 500 as described in FIG. 5 to create a reduced file size text document 802, in accordance with replacement symbol mapping 600 shown in FIG. 6B. FIG. 8C illustrates an example of a reduced file size text document 804 that is space compressed, in accordance with one embodiment. More particularly, FIG. 8C illustrates an example text file 800 that is space compressed by method 500 as described in FIG. 5 to create a reduced file size text document 804, in accordance with replacement symbol mapping 600 shown in FIG. 6C.

In one embodiment of method 500 in operation 502 a text document 800 is received by the space compression module 46 in operation 502. As shown in FIG. 5, method 500 may proceed with operation 504, where it is determined if space compression is allowed for text document 800. In this example it is determined that space compression is allowed and the process proceeds with operation 506, where the first word of the text document 800 is reviewed. For the purposes of this example the process will move from the first word (i.e., "New") of the text document 800 to the last word (i.e., "America") of the text document 800, however as discussed above, one of ordinary skill in the art would understand that the words in the text document could be reviewed in any order.

As shown in FIG. 5, method 500 may proceed with operation 508, where it is determined if the last letter of the reviewed word (i.e., "New") in operation 506 is capitalized (i.e., upper case). In this example it is determined that the last letter of the reviewed word is not capitalized (i.e. lower case) then the process flows to operation 510. In operation 510, the last letter (i.e., "w") of the word is replaced with a replacement symbol, and in one embodiment, a primary replacement symbol 630 (as shown in FIG. 6B or 6C) that corresponds to the last letter 610 (as shown in FIG. 6B or 6C).

For example, in one embodiment as shown in FIG. 8B, the last letter 610, (i.e., "w") corresponds to primary replacement symbol 630 of "Ø" in replacement symbol mapping 600. Therefore, in operation 510, the last letter (i.e., "w") is replaced with primary replacement symbol 630 (i.e., "Ø") as shown in FIG. 8B.

For example, in one embodiment as shown in FIG. 8C the last letter 610, (i.e., "w") corresponds to primary replacement symbol 630 of "W" in replacement symbol mapping 600. Therefore, in operation 510, the last letter (i.e., "w") is replaced with primary replacement symbol 630 (i.e., "W") as shown in FIG. 8C.

Returning to FIG. 5, as shown, method 500 may proceed with operation 514, where the space following the word (i.e. "New") is removed as shown in FIG. 8B and FIG. 8C. As shown in FIG. 5, method 500 may proceed with operation 516, where it is determined if there are additional words in the text document that have not yet been reviewed. In this example there are additional words in the text document 800 that have not yet been reviewed and the process flows to operation 518. In operation 518 the next word in the text document is reviewed. As shown in FIG. 5, method 500 steps through each word in the text document 800 such that word of the text document is reviewed and the last letter of each word of the text document is replaced with a replacement symbol. Further, the space after each word is removed so as to reduce the file size of the text document to create reduced file size text document (for example, 802 or 804) that is space compressed. Accordingly, the "k" of "York", the "s" of "is", the "A" of "USA", etc. are replaced with the corresponding replacement symbol in replacement symbol mapping 600 and the following space is removed as shown in as shown in FIGS. 8B and 8B.

Returning to operation 516, if it is determined that there are no additional words in the text document, then the process flows to operation 520. In operation 520 the metadata for the space compression is saved. As shown in FIG. 5, method 500 may proceed with operation 522, where the reduced file size text document (for example, 802 or 804) is stored within the storage 47 or 65.

One of ordinary skill in the art would understand that the space compression method described herein does not limit compression or other data reduction techniques in combination with the described embodiments. Accordingly, compression, deduplication, or other data reduction techniques could be used in combination with the methods described herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

What is claimed is:

1. A computer-implemented method, comprising:
   receiving a text document by a space compression module for storage within a storage device, wherein the text document comprises a plurality of words separated by spaces and wherein each word includes a last letter;
   determining whether space reduction is enabled based on a mapping policy;
   performing, by the space compression module, the following sequence iteratively for the words in the text document in response to determining that space reduction is enabled:
      replacing the last letter of the words in the text document with a replacement symbol, wherein the replacement symbol is selected from the group consisting of: a primary symbol and a secondary symbol, and
      removing the space after the words so as to reduce the file size of the text document to create a reduced file size text document; and
   saving metadata which indicates that the text document has been space compressed, wherein the metadata includes the mapping policy;
   storing the metadata within the reduced file size text document; and
   storing the reduced file size text document within the storage device.

2. The computer-implemented method of claim 1, wherein the replacement symbol corresponds to the last letter of the word based on the mapping policy.

3. The computer-implemented method of claim 1, comprising, in response to receiving a request for the reduced file size text document, verifying whether the reduced file size text document has been space compressed based on the metadata.

4. The computer-implemented method of claim 3, comprising in response to determining that the reduced file size text document has been space compressed, obtaining the reduced file size text document and replacing, by the space compression module, replacement symbols within the reduced file size text document with the letters that the replacement symbols correspond to based on the mapping policy and adding, by the space compression module, a space immediately following the letters that are replaced to recreate the text document.

5. The computer-implemented method of claim 4, wherein replacing replacement symbols within the reduced file size text document with the letters that the replacement symbols correspond to and adding the space immediately following the letters that are replaced to recreate the text document is performed sequentially through the text document from a first word to a last word in the text document.

6. The computer-implemented method of claim 1, wherein the replacement symbol is the primary symbol in response to determining that the last letter of the word of the text document is lower case and the replacement symbol is the secondary symbol in response to determining that the last letter of the word of the text document is upper case.

7. The computer-implemented method of claim 1, comprising determining whether space reduction is enabled prior to the replacing the last letter of the words in the text document with the replacement symbol based on the mapping policy.

8. The computer-implemented method of claim 1, wherein the last letter of each of the words in the text document are replaced with the replacement symbol in sequence from a first word to a last word in the text document.

9. A computer program product for reducing the file size of a text document, the computer program product comprising a computer readable storage medium having program instructions embodied therewith, wherein the computer readable storage medium is not a transitory signal per se, the program instructions executable by a processor to cause the processor to perform a method comprising:
   receiving a text document for storage within a storage device, wherein the text document comprises a plurality of words separated by spaces and wherein each word includes a last letter;
   replacing the last letter of the words in the text document with a replacement symbol based on a mapping policy;
   removing the space after the words so as to reduce the file size of the text document to create a reduced file size text document;
   saving metadata which indicates that the text document has been space compressed, wherein the metadata includes the mapping policy;
   storing the metadata within the reduced file size text document; and
   storing the reduced file size text document within the storage device.

10. The computer program product of claim 9, wherein the replacement symbol corresponds to the last letter of the word based on the mapping policy.

11. The computer program product of claim 9, wherein the replacement symbol is selected from the group consisting of: a primary symbol and a secondary symbol.

12. The computer program product of claim 11, wherein the replacement symbol is the primary symbol in response to determining that the last letter of the word of the text document is lower case and the replacement symbol is the secondary symbol in response to determining that the last letter of the word of the text document is upper case.

13. The computer program product of claim 9, comprising program instructions for determining whether space reduction is enabled prior to the replacing the last letter of the words in the text document with the replacement symbol based on the mapping policy.

14. The computer program product of claim 9, comprising program instructions for, in response to a request for the text document, obtaining the reduced file size text document and replacing the replacement symbols within the reduced file size text document with the letters that the replacement symbols correspond to based on the mapping policy and adding a space immediately following the letters that are replaced to recreate the text document.

15. A system, comprising: a processor; and
logic integrated with the processor, executable by the processor, or integrated with and executable by the processor, the logic being configured to:
receive a text document for storage within a storage device, wherein the text document comprises a plurality of words separated by spaces and wherein each word includes a last letter;
determine whether to perform space compression on the text document based on a mapping policy stored within the text document and a context of the text document;
in response to determining that space compression on the text document is to be performed, replace the last letter of the words in the text document with a replacement symbol based on the mapping policy;
remove the space after the words so as to reduce the file size of the text document to create a reduced file size text document; and
store the reduced file size text document within the storage device.

16. The system of claim 15, wherein the replacement symbol corresponds to the last letter of the word based on the mapping policy.

17. The system of claim 15, wherein the replacement symbol is selected from the group consisting of: a primary symbol and a secondary symbol.

18. The system of claim 17, wherein the replacement symbol is the primary symbol in response to determining that the last letter of the word of the text document is lower case and the replacement symbol is the secondary symbol in response to determining that the last letter of the word of the text document is upper case.

19. The system of claim 15, comprising logic configured to determine whether space reduction is enabled prior to the replacing the last letter of the words in the text document with the replacement symbol based on the mapping policy.

20. The system of claim 15, comprising logic configured to, in response to a request for the text document, obtain the reduced file size text document and replace replacement symbols within the reduced file size text document with the letters that the replacement symbols correspond to based on the mapping policy and add a space immediately following the letters that are replaced to recreate the text document.

* * * * *